(12) United States Patent
Koo et al.

(10) Patent No.: US 7,888,636 B2
(45) Date of Patent: Feb. 15, 2011

(54) MEASURING ENERGY CONTAMINATION USING TIME-OF-FLIGHT TECHNIQUES

(75) Inventors: Bon Woong Koo, Andover, MA (US); Jonathan Gerald England, Horsham (GB)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 390 days.

(21) Appl. No.: 11/933,934

(22) Filed: Nov. 1, 2007

(65) Prior Publication Data
US 2009/0114813 A1  May 7, 2009

(51) Int. Cl.
*H01J 49/40* (2006.01)
(52) U.S. Cl. .................. 250/287; 250/281; 250/282; 250/286; 250/492.1; 250/492.3
(58) Field of Classification Search .......... 250/281, 250/282, 286, 287, 492.1, 492.2, 492.21, 250/492.3
See application file for complete search history.

(56) References Cited

U.S. PATENT DOCUMENTS

| | | | | |
|---|---|---|---|---|
| 4,694,168 | A * | 9/1987 | Le Beyec et al. | 250/287 |
| 5,659,170 | A * | 8/1997 | Da Silveira et al. | 250/287 |
| 6,831,272 | B2 | 12/2004 | Mack et al. | |
| 7,170,067 | B2 | 1/2007 | Renau et al. | |
| 7,250,617 | B2 * | 7/2007 | Renau et al. | 250/492.21 |
| 2002/0125420 | A1 * | 9/2002 | Park | 250/281 |
| 2005/0178981 | A1 * | 8/2005 | Renau et al. | 250/492.21 |
| 2006/0138316 | A1 * | 6/2006 | Seydoux et al. | 250/282 |
| 2006/0219954 | A1 * | 10/2006 | Low et al. | 250/492.21 |
| 2007/0210248 | A1 * | 9/2007 | Koo et al. | 250/287 |
| 2007/0227231 | A1 * | 10/2007 | Koo et al. | 73/31.05 |
| 2009/0283670 | A1 * | 11/2009 | Koo et al. | 250/282 |

OTHER PUBLICATIONS

Boivin, et al ("Time-of-flight neutral particle analyzer for Alcator C-Mod," Rev. Sci. Instrum. 68 (1), Jan. 1997, pp. 982-987).*

* cited by examiner

*Primary Examiner*—Bernard E Souw
*Assistant Examiner*—Michael Maskell

(57) ABSTRACT

Techniques for measuring energy contamination using time-of-flight (TOF) sensor are disclosed. In one particular exemplary embodiment, the techniques may be realized as a method for detecting energy contamination in an ion beam using time-of-flight comprising directing an ion beam towards an entrance of a sensor, wherein the ion beam may include charged particles and neutral particles, blocking the ion beam periodically from entering the sensor and allowing a pulse of the ion beam to enter the sensor periodically using a gate mechanism, separating the charged particles and the neutral particles of the ion beam pulse based at least in part upon different transit times over a distance caused by variations in at least one of mass and energy associated with the charged particles and the neutral particles, and detecting at least one of the charged particles and the neutral particles separately at a detector based at least in part upon the different transit times.

6 Claims, 8 Drawing Sheets

MEASURING ENERGY CONTAMINATION USING TIME-OF-FLIGHT TECHNIQUES

FIELD OF THE DISCLOSURE

The present disclosure relates generally to semiconductor manufacturing equipment and, more particularly, to measuring energy contamination using time-of-flight (TOF) techniques.

BACKGROUND OF THE DISCLOSURE

Ion implanters are widely used in semiconductor manufacturing to selectively alter the conductivity of materials. In a typical ion implanter, ions generated from an ion source are directed through a series of beam-line components which include one or more magnets and a plurality of electrodes.

FIG. 1 shows a known ion implanter 100 which comprises an ion source 102, extraction electrodes 104, an analyzing magnet 106, a first deceleration (D1) stage 108, a collimating magnet 110, and a second deceleration (D2) stage 112. The analyzing magnet 106 may select desired ion species and filters out contaminant species. The collimating magnet 110 may make the beam substantially parallel when it impacts the workpiece. The D1 and D2 deceleration stages (also known as "deceleration lenses") are each comprised of multiple electrodes with a defined aperture to allow an ion beam to pass therethrough. By applying different combinations of voltage potentials to sections of the beam line and to the multiple electrodes, the D1 and D2 deceleration stages can manipulate ion energies and cause the ion beam to implant a target workpiece 114 at a desired energy.

As the semiconductor industry keeps reducing feature sizes of micro-electronic devices, ion beams with lower energies are desirable in order to achieve shallow dopant profiles for forming shallow junctions. Meanwhile, it is also desirable to maintain a high beam current in order to achieve a high production throughput. Such low-energy, high-current ion beams may be difficult to transport within typical ion implanters due to the drop in efficiency of ion transportation. Therefore, the ion beam may be transported initially at high-energy, and then decelerated before a collimating magnet and/or before a workpiece. However, a portion of the ion beam may react with ambient gases and become neutral due to charge exchange before being decelerated. The neutral portion of the ion beam may not be sufficiently decelerated and will remain as energetic fast neutrals. Thus, the workpiece may be implanted with both low-energy ions and energetic fast neutrals to cause a degradation of the ion implantation process in such parameters as absolute dose, dose uniformity, and/or dopant depth profile.

Existing ion monitoring tools often lack the capability of providing detailed real-time composition information of an ion beam. In a typical ion implanting process, for example, the ion beam may be controlled by monitoring an implant dose based on a Faraday cup current. However, a Faraday cup is just a total charge counter which cannot detect neutral particles. Schemes have been used before in which neutral particles were separated from charged particles by using electrostatic fields, and the neutral particles then detected by impinging them onto a plate, and measuring the secondary electrons that are thereby emitted. However, difficulties may be encountered in measuring the small signal level of the neutral particles in the presence of the much larger ion signal, and due to the secondary electron coefficient of the plate changing with time.

In view of the foregoing, it may be understood that there are significant problems and shortcomings associated with present techniques for sensing neutrals particles and to ensure that predetermined energy contamination requirements are satisfied at all times during implantation processes.

SUMMARY OF THE DISCLOSURE

Measuring energy contamination using TOF techniques are disclosed. Techniques for measuring energy contamination using a TOF sensor are disclosed. In one particular exemplary embodiment, the techniques may be realized as a method for detecting energy contamination in an ion beam using time-of-flight comprising: directing an ion beam towards an entrance of a sensor, wherein the ion beam may include charged particles and neutral particles. The method for detecting energy contamination in an ion beam using time-of-flight may also comprise blocking the ion beam periodically from entering the sensor and allowing a pulse of the ion beam to enter the sensor periodically using a gate mechanism. The method for detecting energy contamination in an ion beam using time-of-flight may further comprise separating the charged particles and the neutral particles of the ion beam pulse based at least in part upon different transit times of the charged particles and the neutral particles over a distance caused by variations in at least one of mass and energy associated with the charged particles and the neutral particles. The method for detecting energy contamination in an ion beam using time-of-flight may furthermore comprise detecting at least one of the charged particles and the neutral particles separately at a detector based at least in part upon the different transit times.

In accordance with other aspects of this particular exemplary embodiment, the charged particles and the neutral particles may be blocked by a gate mechanism and the gate mechanism may be a mechanical gate.

In accordance with further aspects of this particular embodiment, the charged particles may be blocked by a gate mechanism and the gate mechanism may be an electrostatic gate.

In accordance with additional aspects of this particular exemplary embodiment, the charged particles may be blocked by a gate mechanism and the gate mechanism may be a magnetic gate.

In accordance with yet another aspect of this particular exemplary embodiment, the method for detecting energy contamination in an ion beam using time-of-flight may further comprise measuring a background signal associated with the neutral particles for a period of time in order to improve a signal to noise ratio.

In another particular exemplary embodiment, the techniques for measuring energy contamination using a TOF sensor may be realized as a method for processing a workpiece in an ion implanter using a signal from a time-of-flight detector. The method for processing a workpiece in an ion implanter using a signal from a time-of-flight detector may comprise directing an ion beam towards an entrance of a sensor, wherein the ion beam may include charged particles and neutral particles. The method for processing a workpiece in an ion implanter using a signal from a time-of-flight detector may also comprise blocking the ion beam periodically from entering the sensor and allowing a pulse of the ion beam to enter the sensor periodically using a gate mechanism. The method for processing a workpiece in an ion implanter using a signal from a time-of-flight detector may further comprise separating the charged particles and the neutral particles of the ion beam pulse based at least in part upon different transit times over a distance caused by variations in at least one of mass and energy associated with the charged particles and the neutral particles. The method for processing a workpiece in an ion implanter using a signal from a time-of-flight detector may furthermore comprise detecting at least one of the charged particles and the neutral particles separately at a detector based at least in part upon the different transit times. The method for processing a workpiece in an ion implanter using a signal from a time-of-flight detector may moreover comprise outputting a signal from the detector. The method for processing a workpiece in an ion implanter using a signal from a time-of-flight detector may additionally comprise adjusting one or more variables associated with the ion beam based at least in part on outputted signal from the detector.

In accordance with still another aspect of this particular exemplary embodiment, adjusting one or more variables associated with the ion beam may further comprise stopping implantation of the ion beam when a detected energy contamination level may be above a predetermined energy contamination value.

In accordance with further aspects of this particular exemplary embodiment, the charged particles and the neutral particles may be blocked by a gate mechanism and the gate mechanism may be a mechanical gate.

In accordance with additional aspects of this particular exemplary embodiment, the charged particles may be blocked by a gate mechanism and the gate mechanism may be an electrostatic gate.

In accordance with another aspect of this particular exemplary embodiment, the charged particles may be blocked by a gate mechanism and the gate mechanism may be a magnetic gate.

In another particular exemplary embodiment, the techniques for measuring energy contamination using a TOF sensor may be realized as a sensor for detecting an energy contamination level using time-of-flight in an ion implanter. The sensor may comprise an ion beam, a housing having a first end and a second end and a gate mechanism disposed at the first end of the housing. The sensor may also comprise a particle detector disposed at the second end of the housing configured to detect the energy contamination level of the ion beam in response to a flight time of at least one of the charged particles and the neutral particles of the ion beam.

In accordance with yet another aspect of this particular exemplary embodiment, the gate mechanism may be a mechanical gate.

In accordance with still another aspect of this particular exemplary embodiment, the mechanical gate may be a circular disc including one or more one slits configured to block at least one of the charged particles and the neutral particles of the ion beam and the gate mechanism may be configured to rotate at a predetermined rotational speed.

In accordance with further aspects of this particular exemplary embodiment, at least one of a width of the one or more slits and the predetermined rotational speed may be based at least in part on an energy range associated with at least one of the charged particles and the neutral particles of the ion beam.

In accordance with additional aspects of this particular exemplary embodiment, at least one of a width of the one or more slits and the predetermined rotational speed may be based at least in part on a detection period interval of the particle detector.

In accordance with another aspect of this particular exemplary embodiment, the gate mechanism may be an electrostatic gate configured to block the charged particles of the ion beam.

In accordance with yet another aspect of this particular exemplary embodiment, the electrostatic gate may comprise a plurality of electrodes configured to be biased by a voltage pulse to block the charged particles of the ion beam.

In accordance with still another aspect of this particular exemplary embodiment, the electrostatic gate may comprise a shutter configured to move in and out of a path the ion beam to block at least one of the charged particles and the neutral particles of the ion beam when the shutter may be in the path of the ion beam.

In accordance with other aspects of this particular exemplary embodiment, the gate mechanism may be a magnetic gate configured to block the charged particles of the ion beam.

In accordance with further aspects of this particular exemplary embodiment, the particle detector may comprise at least one of a multichannel plate, a channeltron, a bolometer, a faraday and a daly detector.

In accordance with other aspects of this particular exemplary embodiment, the sensor for detecting an energy contamination level may further comprise a system controller configured to adjust one or more variables associated with the ion beam.

In accordance with further aspects of this particular exemplary embodiment, the housing and the particle detector may be configured to be disposed after a first deceleration stage in a path of the ion beam.

In accordance with other aspects of this particular exemplary embodiment, the housing and the particle detector may be configured to be disposed adjacent a workpiece in a path of the ion beam.

In accordance with further aspects of this particular exemplary embodiment, the housing and the particle detector may be configured to move in and out of a path of the ion beam.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Embodiments of the present disclosure provide an energy contamination sensor utilizing one or more TOF techniques that may be suitable for in-situ monitoring and/or controlling of an ion implanting process.

Figure 1:
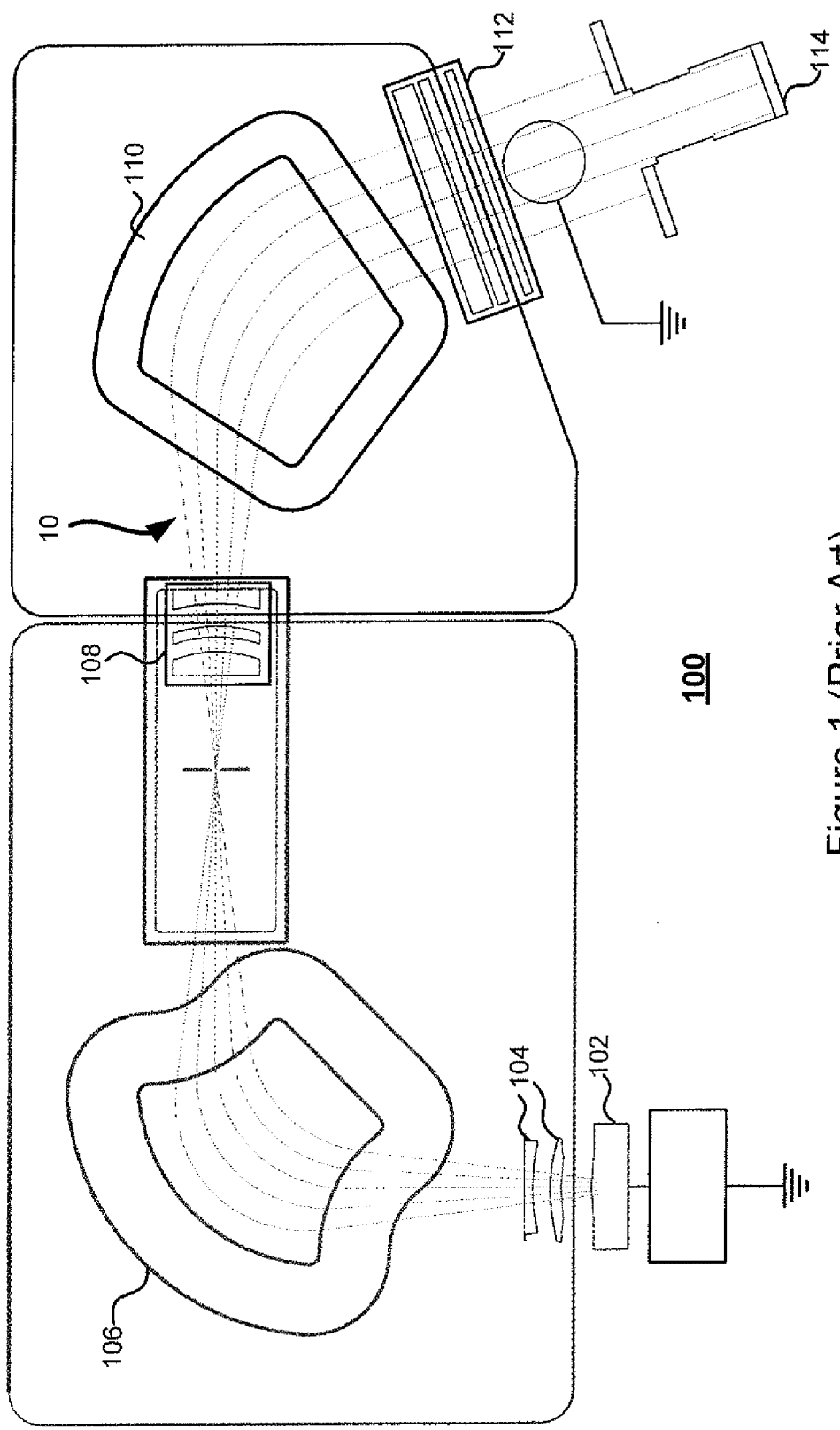
FIG. 1 shows an exemplary conventional ion implanter.
Figure 2:
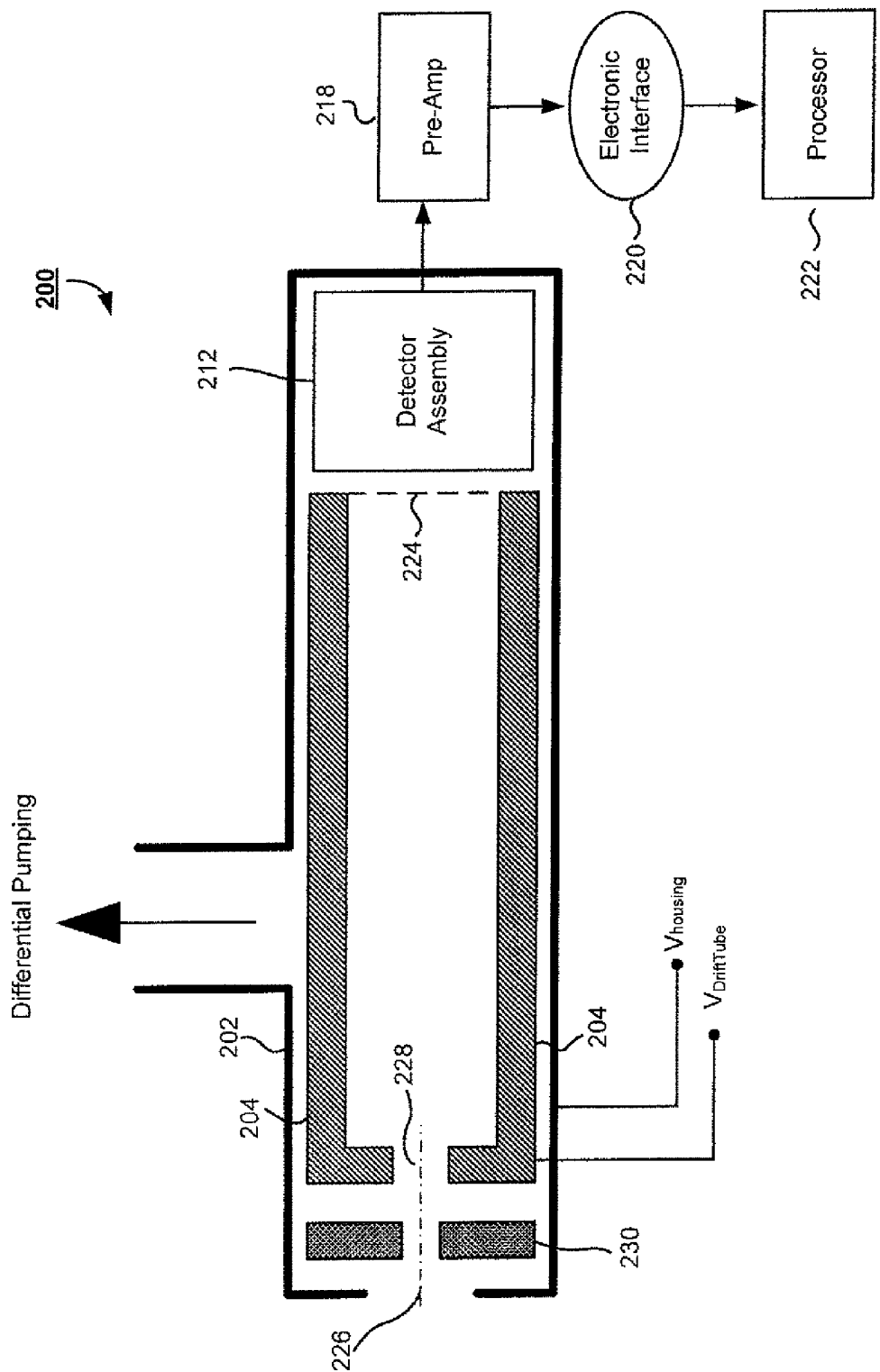
FIG. 2 shows a TOF sensor having one exemplary configuration in accordance with an embodiment of the present disclosure.

Referring to FIG. 2, there is shown an exemplary TOF sensor 200 in accordance with an embodiment of the present disclosure. TOF sensor 200 may comprise a housing 202 that may be adapted for installation in a particle beam path and may accommodate differential pumping. The housing 202 may be individually biased at a desired potential $V_{housing}$. A first side of the housing 202 may be referred to as an "entrance side" since particles from an ion beam enter the TOF sensor 200 through an aperture 226 ("housing aperture") on the first side of the housing 202. A second side of the housing 202 may be referred to as a "detector side" since particle detection takes place on the second side of the housing 202.

TOF sensor 200 may also comprise a drift tube 204 inside the housing 202 which may also be individually biased, for example, at a desired potential $V_{DriftTube}$. The drift tube 204 may have a hollow space with a negligible electromagnetic field. An extractor side of the drift tube 204 may have an aperture 228 ("drift tube aperture") for admitting particles. A detector side of the drift tube 204 may have a grid 224 that allows particles to exit while shielding out external electric fields. The pressure in the process equipment may be typically $10^{-5}$ Torr, while the pressure in the drift tube 204 is at $2 \times 10^{-6}$ Torr or less. Therefore, differential pumping may be provided to accommodate the pressure difference.

Before the entrance side of the drift tube 204, there may be a gate mechanism 230. For example, the gate mechanism 230 may be an electrical gate, a magnetic gate, a mechanical gate and/or a combination of electrical gate, magnetic gate and mechanical gate. For example, the gate mechanism 230 may be an electrical gate and may include a series of electrodes. In addition, the series of electrodes for the gate mechanism 230 may also be utilized for extracting and/or focusing particles. For example, the series of electrodes for the gate mechanism 230 may be disposed next to the housing aperture 226. The series of electrodes for the gate mechanism 230 may have an aperture typically between 0.1 and 10 cm in diameter, although the actual aperture size may be varied based at least in part on different design needs. In another embodiment, the electrical gate mechanism may be replaced by a magnetic field gate. This may use a magnetic, rather than electric field to controllably block charged particles from entering the TOF sensor 200.

As illustrated in FIG. 2, the gate mechanism 230 may be disposed within the housing 202. In other various embodiments, the gate mechanism 230 may be a mechanical gate disposed outside the housing 202. Also, the gate mechanism 230 may be aligned with the housing aperture 226 to block charged particles and/or neutral particles. Further, the gate mechanism 230 may be mobile to move up/down and/or left/right to be in or out of the path of the ion beam 10.

Once admitted into the drift tube 204, the particles may drift towards the detector side of the drift tube 204 unaffected by any electric field. With a similar kinetic energy, heavy particles may travel slower and light particles may travel faster. Given sufficient flight time (i.e., sufficient length of the drift tube 204), the particles may become separated into packets with arrival times based on the mass and energy of each particle species.

A detector assembly 212 may be disposed near the detector side of the drift tube 204. The detector assembly 212 may be used to detect the particles. The detector assembly 212 may be any type of particle detection device which may not rely on the charge state of the particles (e.g., micro-channel plate (MCP) assembly, channeltron and/or pyrometer/bolometer) to detect the particles. Detection and/or collection of the particles may be controlled, for example, with one or more voltage biases such as $V_{MCP}$. The detector assembly 212 may be coupled to a pre-amplifier 218 that is in turn coupled to a processor unit 222 via an electronic interface 220. The electronic interface 220 may be, for example, a fast data acquisition card, and the processor unit 222 may be, for example, a personal computer (PC) or other type of computing device. The individual packets, having distinct mass and/or energy, may be detected sequentially, and corresponding signals may be amplified by the pre-amplifier 218. When the signals are processed in the processor unit 222, signals corresponding to each individual packet may produce a mass/energy peak in a mass/energy spectrum. Therefore, the energy contamination may be calculated based at least in part on the detection of a charged particle signal and/or a neutral particle signal.

Accordingly, the TOF sensor 200 may be flexibly configured by applying different combinations of voltage potentials to the housing 202, the drift tube 204, and the detector assembly 212. Therefore, the TOF sensor 200 may achieve blocking of charged particles. As mentioned above, the gate mechanism 230 may be an electrical gate and thus the gate mechanism 230 may be biased with a voltage to block the charged particles. The voltage may be changed for a short period of time to admit a pulse of charged particles into the TOF sensor 200. However, the neutral particles may not be affected by the electrical gate and therefore may not be blocked.

Figure 3:
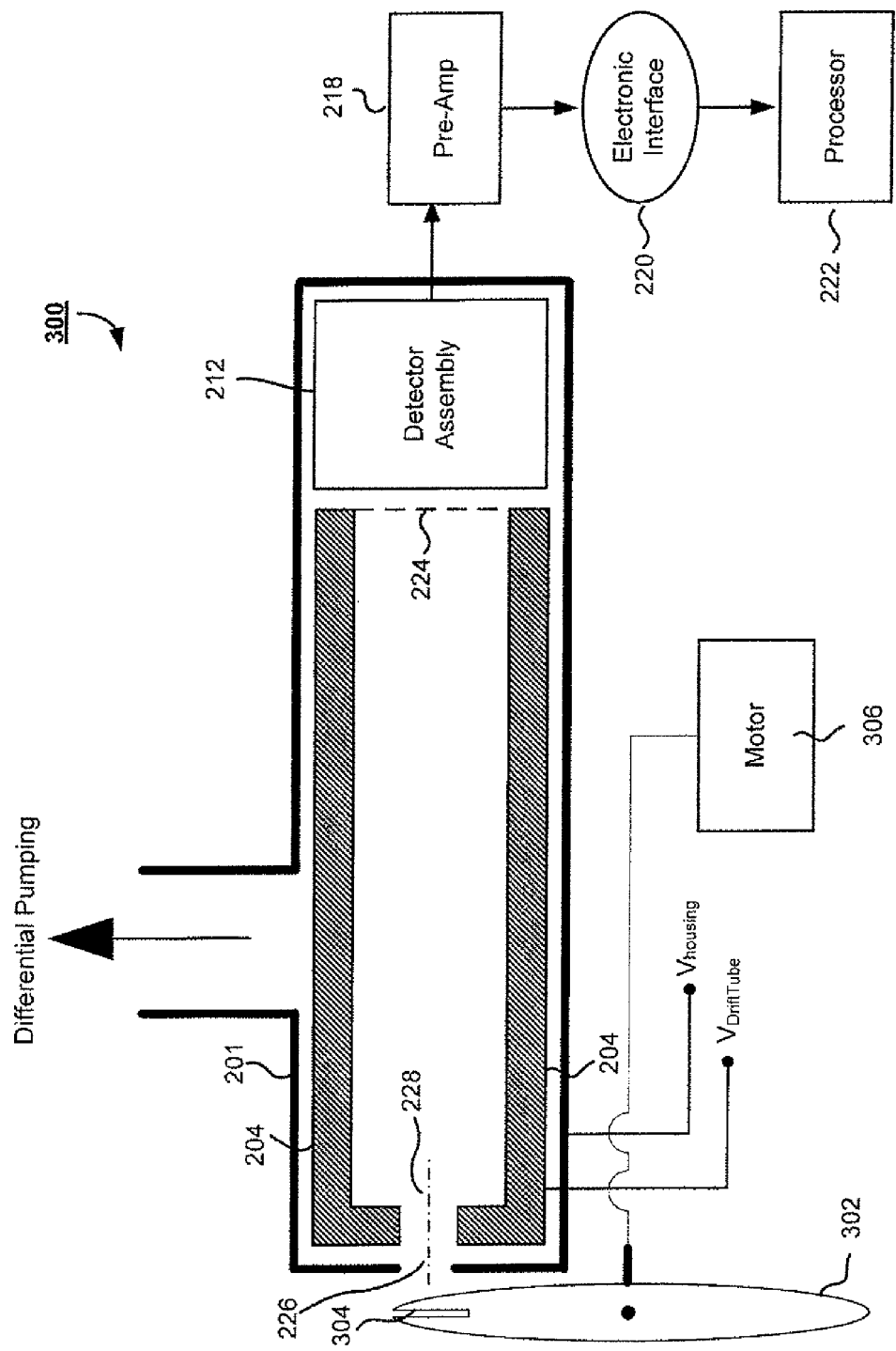
FIG. 3 shows a TOF sensor having another exemplary configuration in accordance with an embodiment of the present disclosure.

FIG. 3 shows a TOF sensor 300 having one exemplary configuration in accordance with an embodiment of the present disclosure. The TOF sensor 300 may comprise substantially the same components as the TOF sensor 200 shown in FIG. 2. Compared to FIG. 2, the main difference in this exemplary configuration is that the TOF sensor 300 may include a mechanical gate 302. The mechanical gate mechanisms 230 may block both charged particles and/or neutral particles.

For example, the mechanical gate 302 may be made from a conductive material such as aluminum, graphite, silicon, SiC and/or refractory metal such as tungsten and/or tantalum. The mechanical gate 302 may be configured to have a circular disc shape having one or more predetermined number of slits 304. The mechanical gate 302 may also be configured to have rectangular, oval, square, triangle, pentagon, hexagon, heptagon and/or other shapes for blocking a particle species. The one or more predetermined number of slits 304 may be disposed near an edge portion of the mechanical gate 302. Also, the one or more predetermined number of slits 304 may be disposed near a center portion of the mechanical gate 302. The mechanical gate 302 may be coupled to a motor 306. The mechanical gate 302 may be rotated at a constant speed, rotated over varying speeds throughout each rotation or only rotated forwards and backwards through a restricted range of angles. The predetermined constant rotational speed of the mechanical gate 302, the predetermined number of slits 304 and/or the placement of the slits 304 may be determined based at least in part on an energy range of the charged particles and neutral particles. Also, the predetermined rotational speed of the mechanical gate 302 may be synchronized with the detector assembly 212 to monitor a current tool process.

Figure 4:
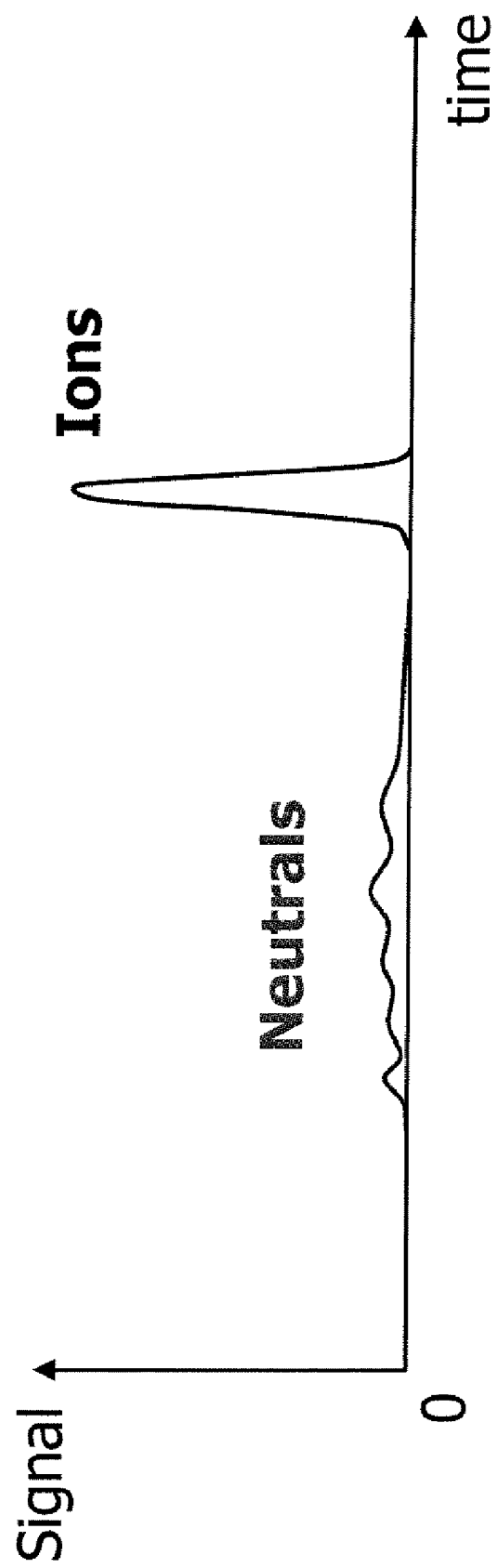
FIG. 4 shows a plot of charged particle signal and neutral particle signal in accordance with the embodiment shown in FIG. 3 of the present disclosure.

FIG. 4 shows a plot of charged particle signal and neutral particle signal in accordance with the embodiment shown in FIG. 3 of the present disclosure. During the transport of the ion beam at high energy, a portion of the ion beam may react with ambient gases and become neutral particles due to charge exchange. The neutral particles may not be decelerated by the first deceleration stage 108 and/or the second deceleration stage 112 and thus traveling at a higher energy and/or speed than the decelerated charged particles. Therefore, the time of flight to the detector assembly 212 for the charged particles and the neutral particles may be different. As discussed above, the mechanical gate 302 may be rotated by motor 306 at a predetermined speed. During the rotation of the mechanical gate 302, for a short period of time the opening of the slits 304 may be aligned with the opening of the aperture 226. During the period of time the opening of the slits 304 may be aligned with the aperture 226, a pulse of both the charged particles and the neutral particles may enter the housing 204 to reach the detector assembly 212. As the pulse of charged particles and the neutral particles travel over a distance towards the detector assembly 212, the charged particles and the neutral particles may be separated due to at least one of mass and energy associated with the charged particles and the neutral particles. For example, as illustrated by FIG. 3, a pulse of neutral particles and a pulse of charged particles may enter the housing 204 to reach the detector assembly 212. Because the pulse of neutral particles may be traveling at a higher speed than the pulse of charged particles, the pulse of neutral particles may reach the detector assembly 212 at an earlier time than the pulse of charged particles. The pulse of neutral particles may have broad spectrum and multiple peaks because the pulse of neutral particles may be generated at various positions of a deceleration lens. Thus, the detector assembly 212 may detect the neutral particles and the charged particles at different times and therefore measures a degree of energy contamination in a decelerated ion beam. The rotating mechanical gate 302 may be time-integrated to a predetermined period of time to increase a signal-to-noise ratio efficiency and/or accuracy. Also, the rotational speed of the mechanical gate 302 may be predetermined and/or varied to enable the detector assembly 212 to detect the charged particles and the neutral particles at a predetermined period interval. For example, the detector assembly 212 may detect the charged particles and the neutral particles once every second. Therefore, the rotational speed of the mechanical gate 302 may be configured to align the slits 304 of the mechanical gate 302 with the aperture 226 once every second in order to allow the charged particles and the neutral particles to be detected by the detector assembly 212.

Figure 5:
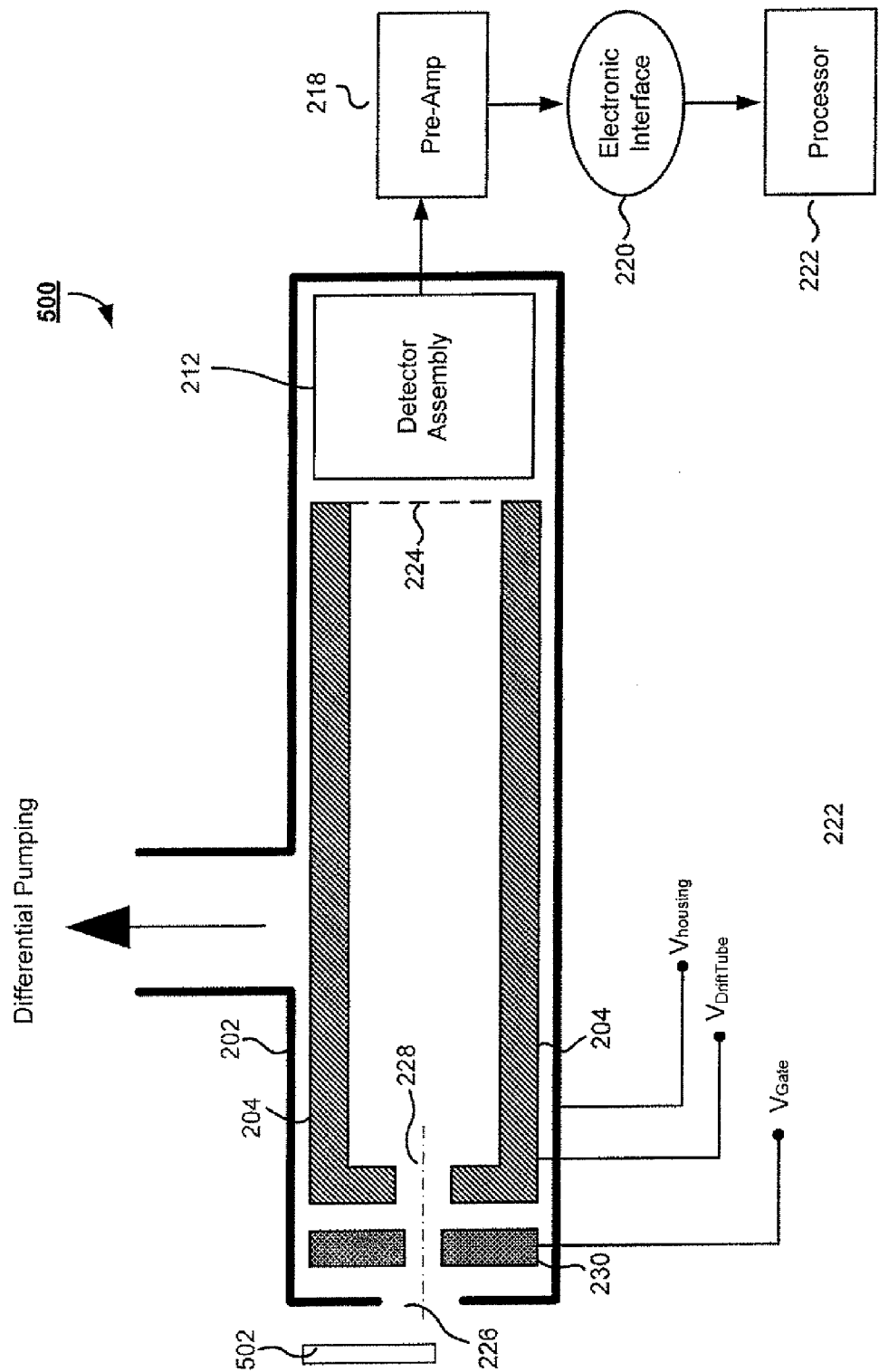
FIG. 5 shows a TOF sensor having another exemplary configuration in accordance with an embodiment of the present disclosure.

FIG. 5 shows a TOF sensor 500 having yet another exemplary configuration in accordance with an embodiment of the present disclosure. The TOF sensor 500 may comprise substantially the same components as the TOF sensor 200 shown in FIG. 3. Compared to FIG. 3, the main difference in this exemplary configuration is that the TOF sensor 500 may include a mechanical shutter 502 which may be translated rather than rotated. The mechanical shutter 502 may be made from a conductive material such as aluminum, graphite, silicon, SiC, refractory metal such as tungsten and/or tantalum. The length of the mechanical shutter 502 may be configured to be longer than the width of the aperture 226 to sufficiently block the charged particles and the neutral particles from entering the TOF sensor 500. In addition, the mechanical shutter 502 may move from a position that does not block aperture 226 to a position that does block aperture 226 to prevent the charged particles and the neutral particles from entering the TOF sensor 500. This may be by translation up and down or from side-to-side. The mechanical shutter 502 may be left shut when the time of flight spectrometer is not being used to protect the detector 212 from excessive particle embodiment.

Figure 6:
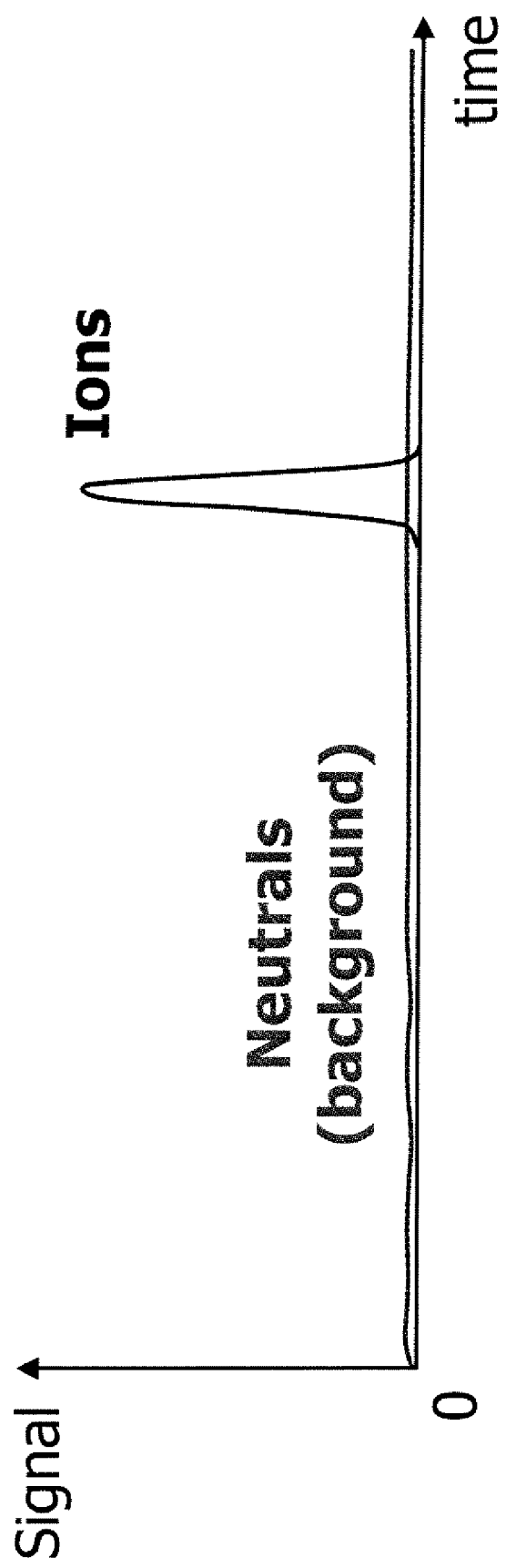
FIG. 6 shows a plot of charged particle signal and neutral particle signal in accordance with the embodiment shown in FIG. 5 of the present disclosure.

FIG. 6 shows a plot of charged particle signal and neutral particle signal in accordance with the exemplary embodiment shown in FIG. 5 of the present disclosure. As illustrated in FIG. 6, in the event that the mechanical shutter 502 is lifted from the front of the housing 204, particles may enter the housing 204. The neutral particles may enter the housing 204 whether or not the electrical gate mechanisms 230 is in the open mode or the closed mode. The detector assembly 212 may detect as a constant signal based at least in part on the amount of the pulse of neutral particles entering the housing. A pulse of charged particles may enter into the housing 204 during a period of time only when the electrical gate 230 may be biased in the open mode. The electrical gate may be biased in the open mode via an electrical pulse The ion beam 10 will be detected by the detector assembly 212 at a time after the gate pulse given by flight time of the pulse of charged particles. As the ion beam 10 have a known energy, the ion beam 10 may be easily identified by their arrival time.

Figure 7:
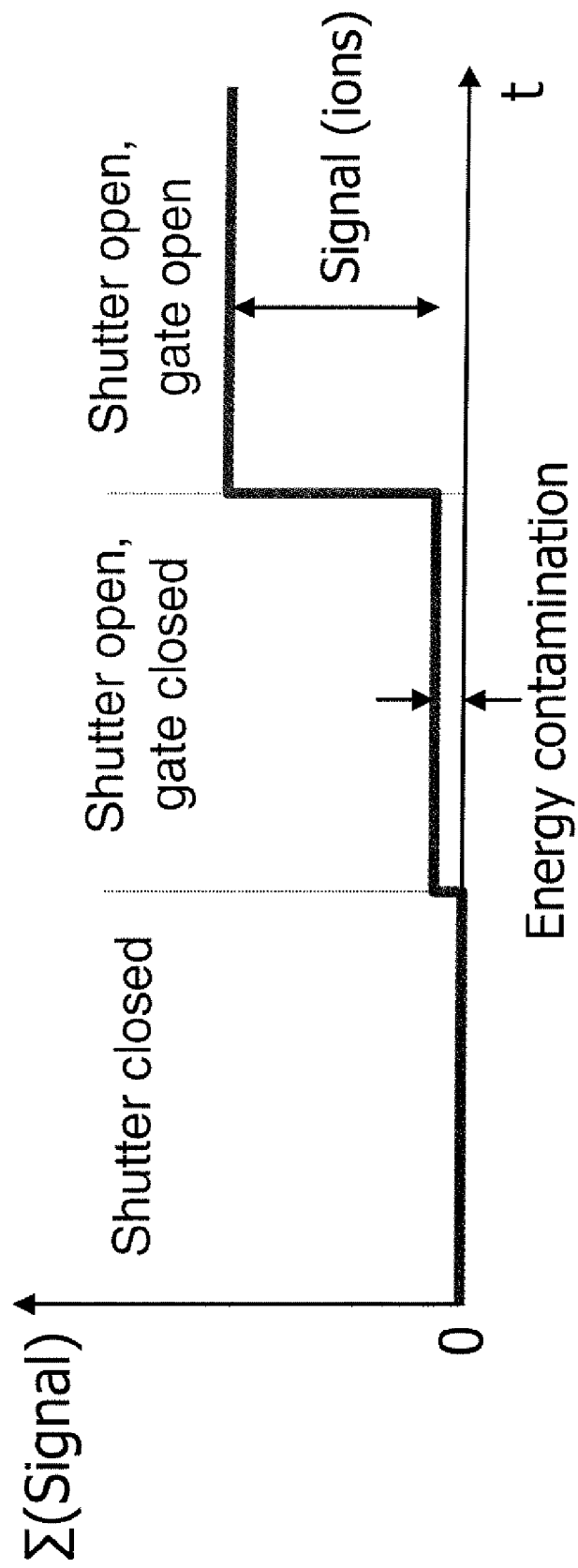
FIG. 7 shows a plot of time integrated signals in accordance with the embodiment shown in FIG. 5 of the present disclosure.

FIG. 7 shows a plot of the time integrated charged particle signals in accordance with the embodiment shown in FIG. 5 of the present disclosure. As illustrated, when the mechanical shutter 502 is closed, no particle signal is detected by the detector assembly 212 because the mechanical shutter 502 blocks both the charged particles and the neutral particles. However, the electrical background signal due to, for example, random noise in the detector 212, pre-amplifier 218 and interface electronics 220 may be determined at this time. When the mechanical shutter 502 is open and the electrical gate mechanism 230 may be biased in a closed mode, charged particles may be blocked whilst neutral particles still may enter the housing 204. Therefore, the detector assembly 212 may detect the neutral particles. As illustrated in FIG. 7, the signal strength associated with the neutral particles may be small compared to the signal strength associated with the pulse of the charged particles. Therefore, the signal associated with the neutral particles may be measured for a long period of time in order to ensure the accuracy of the measurement. Further, when the mechanical shutter 502 is open and the electrical gate mechanism 230 is biased in an open mode, a pulse of the charged particles (and the neutral particles) may enter housing 204 and be detected by the detector assembly 212. The ion beam signal may be measured by only integrating the detected signal within an energy window set around the expected arrival time of the ion beam 10 at the detector 212 after the electrical gate pulse. As the ion beam signal may be several orders of magnitude greater than the neutral contamination signal, the ion beam signal may not need to be measured for as long as the background signal to allow an accurate determination of the intensity ratio of the neutral, energy contamination to ion beam 10.

Although this technique has been described in relation to the mechanical gate embodiment illustrated in FIG. 5, it will be understood that the technique could be applied with the mechanical gate embodiment illustrated in FIG. 3.

Figure 8:
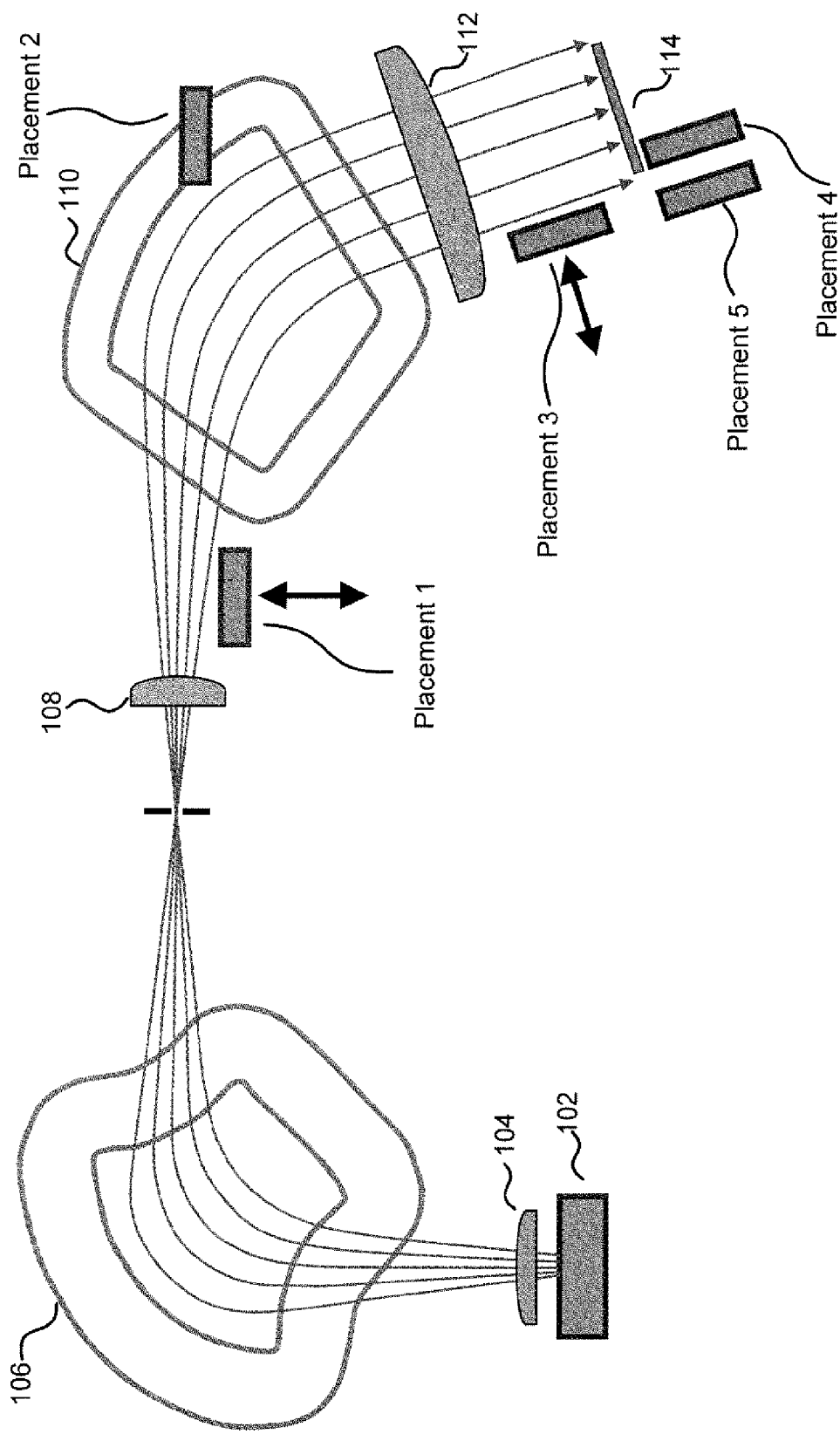
FIG. 8 shows possible locations for a TOF sensor in accordance with an embodiment of the present disclosure.

One having ordinary skill in the art may appreciate that the TOF sensor 200, 300 and/or 500 may be disposed at various locations along the particle beam path. FIG. 8 shows possible exemplary installation locations for a TOF sensor in accordance with an embodiment of the present disclosure. For example, TOF sensor 200, 300 and/or 500 may be disposed at placement 1. Placement 1 may be located after the first deceleration (D1) stage 108. Also for example, TOF sensor 200, 300 and/or 500 may be disposed at placement 2 which is within the magnet collimator 110. In order for the TOF sensor 200, 300 and/or 500 to properly measure the energy contamination of the ion implanting process at placement 2, the magnetic field in the magnet collimator 110 may be switched off to allow the charged particles and the neutral particles to enter the TOF sensor 200, 300 and/or 500. Furthers TOF sensor 200, 300 and/or 500 may be disposed at placement 3 which is after the second deceleration (D2) stage 112. Furthermore, TOF sensor 200, 300 and/or 500 may be disposed at placement 4 which is behind the workpiece 114. Placements 1-4 may be utilized at a set-up period of the ion beam implanting process and/or at an end period of the ion beam implanting process. Finally, TOF sensor 200, 300 and/or 500 may be disposed adjacent placement 5. For example, the TOF sensor 200, 300 and/or 500 may be disposed near to an edge of the workpiece 114. Moreover, each TOF sensor 200, 300 and/or 500 disposed at placements 1-5 may be adjustable to move in and out of the ion beam 10 path. For example, as illustrated in FIG. 8, arrow disposed near placement 1 may indicate that the TOF sensor 200, 300 and/or 500 disposed at placement 1 may move up or down to be in and out of the path of the ion beam 10.

The amount of energy contamination measured by the TOF sensor 200, 300 and/or 500 may be used by an operator of the ion implanter or by an automated control system of the implanter in several ways. If the energy contamination is measured to be too high before the commencement of the implanting process, the implant process may be prohibited from starting until corrective action has been carried out to reduce the energy contamination below an allowed limit. For example, corrective action may be to alter ion beam tuning parameters that may include ion beam intensity and/or the deceleration ratio where the energy of the ion beam is reduced in the first deceleration (D1) stage 108 and/or the second deceleration (D2) stage 112. If the energy contamination becomes too high during the implanting process, the implanting process may be stopped, or paused until corrective action has taken. For example, the corrective action may include allowing the vacuum system to reduce the beamline pressure by pumping away material that may have out gassed from the workpiece and/or reducing the beam current.

At this point it should be noted that the TOF sensors in accordance with the present disclosure as described above typically involves the processing of input data and the generation of output data to some extent. This input data processing and output data generation may be implemented in hardware or software. For example, specific electronic components may be employed in an ion implanting tool or similar or related circuitry for implementing the functions associated with in-situ monitoring of particle species in accordance with the present disclosure as described above. Alternatively, one or more processors operating in accordance with stored instructions may implement the functions associated with in-situ monitoring of energy contamination value in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes Accordingly, the claims set forth below should be construed in view of the full breadth and spirit of the present disclosure as described herein.

The invention claimed is:

1. A method for detecting energy contamination in an ion beam using time-of-flight comprising:
    directing an ion beam towards an entrance of a sensor, wherein the ion beam includes charged particles and neutral particles;
    completely blocking the ion beam from entering the sensor;
    measuring a background signal while the ion beam is completely blocked;
    blocking the ion beam periodically from entering the sensor with an electrostatic gate and allowing a pulse of the ion beam to enter the sensor periodically using the electrostatic gate;
    separating the charged particles and the neutral particles of the ion beam pulse based at least in part upon different transit times of the charged particles and the neutral particles over a distance caused by variations in at least one of mass and energy associated with the charged particles and the neutral particles; and
    detecting at least one of the charged particles and the neutral particles separately at a detector based at least in part upon the different transit times.

2. The method according to claim 1, further comprising outputting a signal from the detector and adjusting one or more variables associated with the ion beam based at least in part on the signal from the detector.

3. The method according to claim 2, wherein the adjusting one or more variables associated with the ion beam further comprises stopping implantation of the ion beam when a detected energy contamination level is above a predetermined energy contamination value.

4. A method for detecting energy contamination in an ion beam using time-of-flight comprising:
    directing an ion beam towards an entrance of a sensor, wherein the ion beam includes charged particles and neutral particles;
    completely blocking the ion beam from entering the sensor;
    measuring a background signal while the ion beam is completely blocked;
    detecting the neutral particles in the ion beam by preventing the charged particles from entering the sensor using an electrostatic gate; and
    detecting both the charged particles and neutral particles.

5. The method according to claim 4, further comprising outputting a signal from the detector and adjusting one or more variables associated with the ion beam based at least in part on the signal from the detector.

6. The method according to claim 5, wherein the adjusting one or more variables associated with the ion beam further comprises stopping implantation of the ion beam when a detected energy contamination level is above a predetermined energy contamination value.

* * * * *